United States Patent
LeBlanc (10) Patent No.: US 11,174,987 B2
(45) Date of Patent: Nov. 16, 2021

(54) CEILING-MOUNTABLE, PLUG-IN FAN

(71) Applicant: William Paul LeBlanc, Westminster, CO (US)

(72) Inventor: William Paul LeBlanc, Westminster, CO (US)

(*) Notice: Subject to any disclaimer, the term of this patent is extended or adjusted under 35 U.S.C. 154(b) by 0 days.

(21) Appl. No.: 16/804,764

(22) Filed: Feb. 28, 2020

(65) Prior Publication Data
US 2021/0003246 A1 Jan. 7, 2021

Related U.S. Application Data

(60) Provisional application No. 62/869,197, filed on Jul. 1, 2019.

(51) Int. Cl.
*F16M 13/02* (2006.01)
*H05K 5/02* (2006.01)

(52) U.S. Cl.
CPC ......... *F16M 13/027* (2013.01); *H05K 5/0204* (2013.01); *H05K 5/0247* (2013.01)

(58) Field of Classification Search
None
See application file for complete search history.

(56) References Cited

U.S. PATENT DOCUMENTS

| | | | | | |
|---|---|---|---|---|---|
| 5,567,117 A | * | 10/1996 | Gunn | .................... | F04D 25/088 248/222.52 |
| 5,845,886 A | * | 12/1998 | McCormick | .......... | F04D 29/601 248/200.1 |
| 6,036,154 A | * | 3/2000 | Pearce | .................. | F04D 25/088 248/343 |
| 6,116,559 A | * | 9/2000 | Lackey | ................. | F04D 29/601 248/343 |
| 6,305,974 B1 | * | 10/2001 | Tseng | ................... | H01R 4/4818 248/342 |
| 8,215,920 B2 | | 7/2012 | Criner et al. | | |

(Continued)

FOREIGN PATENT DOCUMENTS

EP 0730095 A1 9/1996

OTHER PUBLICATIONS

"12V Ceiling Fan SENREAL 19.7" Portable Ceiling Fan Hanging Camping Tent Fans for Outdoor Gazebo Battery Powered Mini Ceiling Fan Silent Design Compatible Solar Power 12V Battery", https://www.amazon.com/Ceiling-SENREAL-Portable-Hanging-Compatible/dp/B07W82Z7HY.

(Continued)

*Primary Examiner* — Xanthia C Cunningham (57) ABSTRACT

An objective of the present invention is to provide users with a mounting kit that enables any ceiling fan to be mounted on the ceiling, as well as be powered through an electrical outlet via a power plug. In other words, the present invention intends to provide users with a device that can make the installation of a ceiling fan less cumbersome and more efficient, without having to have hardwiring. Further, the present invention comprises a remote control that enables users to control or operate the ceiling fan remotely or from a distance. Furthermore, the present invention comprises a cable raceway that helps to hide the power cord and provide aesthetic appeal to the arrangement. Thus, the present invention allows a user to enjoy the benefits of a ceiling fan at low cost and better convenience.

3 Claims, 6 Drawing Sheets

(56) References Cited

U.S. PATENT DOCUMENTS

| | | | |
|---|---|---|---|
| 8,336,844 B2* | 12/2012 | Pearce | F04D 29/601 248/345 |
| 8,348,220 B2 | 1/2013 | Carter | |
| 8,802,985 B2* | 8/2014 | Lettkeman | H02G 3/22 174/66 |
| 10,250,003 B2* | 4/2019 | Walker | H01R 29/00 |
| 10,658,131 B2* | 5/2020 | Escurier | H05K 5/023 |
| 10,890,191 B2* | 1/2021 | Broughman | F24F 7/007 |
| 2002/0163812 A1* | 11/2002 | Tseng | F21V 21/03 362/404 |
| 2006/0254190 A1* | 11/2006 | Hunt | E04B 9/006 52/698 |
| 2008/0055409 A1* | 3/2008 | Mars | G08B 13/1963 348/143 |
| 2008/0181782 A1* | 7/2008 | Pearce | F04D 29/601 416/244 R |
| 2008/0181783 A1* | 7/2008 | Pearce | F04D 25/088 416/244 R |
| 2008/0193291 A1* | 8/2008 | Ware | F04D 25/088 416/5 |
| 2012/0068042 A1* | 3/2012 | Carter | F16M 13/02 248/674 |
| 2013/0292149 A1* | 11/2013 | Cooper | H02G 3/14 174/44 |
| 2015/0090858 A1* | 4/2015 | Broughman | F04D 25/088 248/674 |
| 2016/0047391 A1* | 2/2016 | McPherson | F04D 25/088 417/423.7 |
| 2016/0111816 A1* | 4/2016 | Walker | H01R 13/26 417/423.7 |
| 2017/0115019 A1* | 4/2017 | Desmet | G05B 15/02 |
| 2017/0344042 A9* | 11/2017 | Davis | H04W 84/18 |

OTHER PUBLICATIONS

"Allen & Roth Valdosta 20-in Oil-Rubbed Bronze Outdoor Downrod Mount Ceiling Fan", https://www.amazon.com/Valdosta-Oil-Rubbed-Outdoor-Downrod-Ceiling/dp/B01HFKVLXW/.

* cited by examiner

CEILING-MOUNTABLE, PLUG-IN FAN

The current application claims a priority to the U.S. Provisional Patent application Ser. No. 62/869,197, filed on Jul. 1, 2019.

FIELD OF THE INVENTION

The present invention relates generally to a plug-in ceiling fan. More specifically, the present invention is a mounting kit that enables a ceiling fan to be mounted to a surface and plugged in to an electrical outlet.

BACKGROUND OF THE INVENTION

In the present society, more individuals are actively pursuing décor elements that accentuate their own personal tastes. Most ceiling fans are permanent décor elements that require hardwiring. It is often difficult for most individuals to install these kinds of ceiling fans because they do not have the expertise to hardwire a ceiling fan and hiring a professional to perform such installations can be expensive. Thus, installation and/or replacement of ceiling fans can be a cumbersome and expensive process. Further, even if people experience the need for a ceiling fan in a particular interior space, it may not be realized if they don't have the necessary internal hard wiring done in that particular internal space. Thus, a regular ceiling fan, which can be mounted to a surface without hardwiring, and which can be easily powered by a regular power outlet is a rare find in the current market.

An objective of the present invention is to provide users with a mounting kit that enables any ceiling fan available in the market, to be ceiling-mounted, as well as be powered through a common electrical outlet. In other words, the present invention intends to provide users with a device that can make the installation of a ceiling fan less cumbersome and more efficient, without having to have hardwiring. Accordingly, the present invention comprises a mounting bracket, an electrical system, a power cord and a power plug. These components enable any ceiling fan to be mounted to the ceiling via the mounting bracket and be electrically connected to an electrical outlet via the power plug. Further, the present invention comprises a remote control that enables users to control or operate the ceiling fan remotely from a distance. Furthermore, the present invention comprises a cable raceway that helps to hide the power cord and provide aesthetic appeal to the entire arrangement. Thus, the present invention allows a person to enjoy the benefits of a ceiling fan at low cost and better convenience, by being able install the ceiling fan in any room easily without having to hardwire the installation.

DETAIL DESCRIPTIONS OF THE INVENTION

All illustrations of the drawings are for the purpose of describing selected versions of the present invention and are not intended to limit the scope of the present invention.

In reference to FIG. 1 through FIG. 6, the present invention is a mounting kit for a plug-in ceiling fan. An objective of the mounting kit is to provide users with a device that enables a ceiling fan to be ceiling-mounted, as well as be powered through a common electrical outlet. In other words, the present invention intends to provide users with a device, that can make the installation of a ceiling fan less cumbersome and more efficient, without having to have hardwiring. Accordingly, the present invention comprises a mounting bracket, an electrical system, a power cord and a power plug. These components enable any ceiling fan available in the current market to be mounted onto the ceiling, and be electrically connected to an electrical wall outlet, via the power plug. Further, the present invention comprises a remote control that enables users to control or operate the ceiling fan remotely or from a distance. Furthermore, the mounting kit comprises a cable raceway that helps to hide the power cord and provide aesthetic appeal to the arrangement. Thus, the present invention allows a person to enjoy the benefits of a ceiling fan at low cost and better convenience.

The following description is in reference to FIG. 1 through FIG. 6. As seen in FIG. 1 through FIG. 4, the mounting kit comprises a mounting bracket 1, and the mounting bracket 1 comprises a bracket body 2, a fan-coupling mechanism 3, a ceiling mounting mechanism 4 and an electrical coupler 5. The bracket body 2 comprises any shape, size, material, features, type or kind, orientation, components, and arrangements of components that would allow the present invention to fulfill the objectives and intents of the present invention. However, it can be preferred that the bracket body 2 comprises a material similar to and/or compatible with the material of the present invention. It is an aim of the mounting kit to enable users to have a ceiling-mounted fan, as well as be able to power the fan through a common electrical outlet, without requiring hard wiring. In order to accomplish that, the fan-coupling mechanism 3 is mounted adjacent to the bracket body 2, and the ceiling-mounting mechanism 4 is mounted adjacent to the bracket body 2, opposite to the fan-coupling mechanism 3. In other words, one end of the bracket body 2 comprises provisions for attaching to any ceiling fan through the fan-coupling mechanism 3, and the opposite end of the bracket body 2 comprises provisions for attaching to any planar surface (preferably to a ceiling surface), through the ceiling-mounting mechanism 4. According to the preferred embodiment of the present invention, the electrical coupler 5 is mounted within the bracket body 2, such that the electrical coupler 5 is not visible outside after fan installation. Preferably, the electrical coupler 5 has dimensions to fit within the bracket body 2, however, the electrical coupler 5 may comprise any size, shape, brand, orientation, location, components or arrangement of components, that are known to one of ordinary skill in the art.

Figure 1:
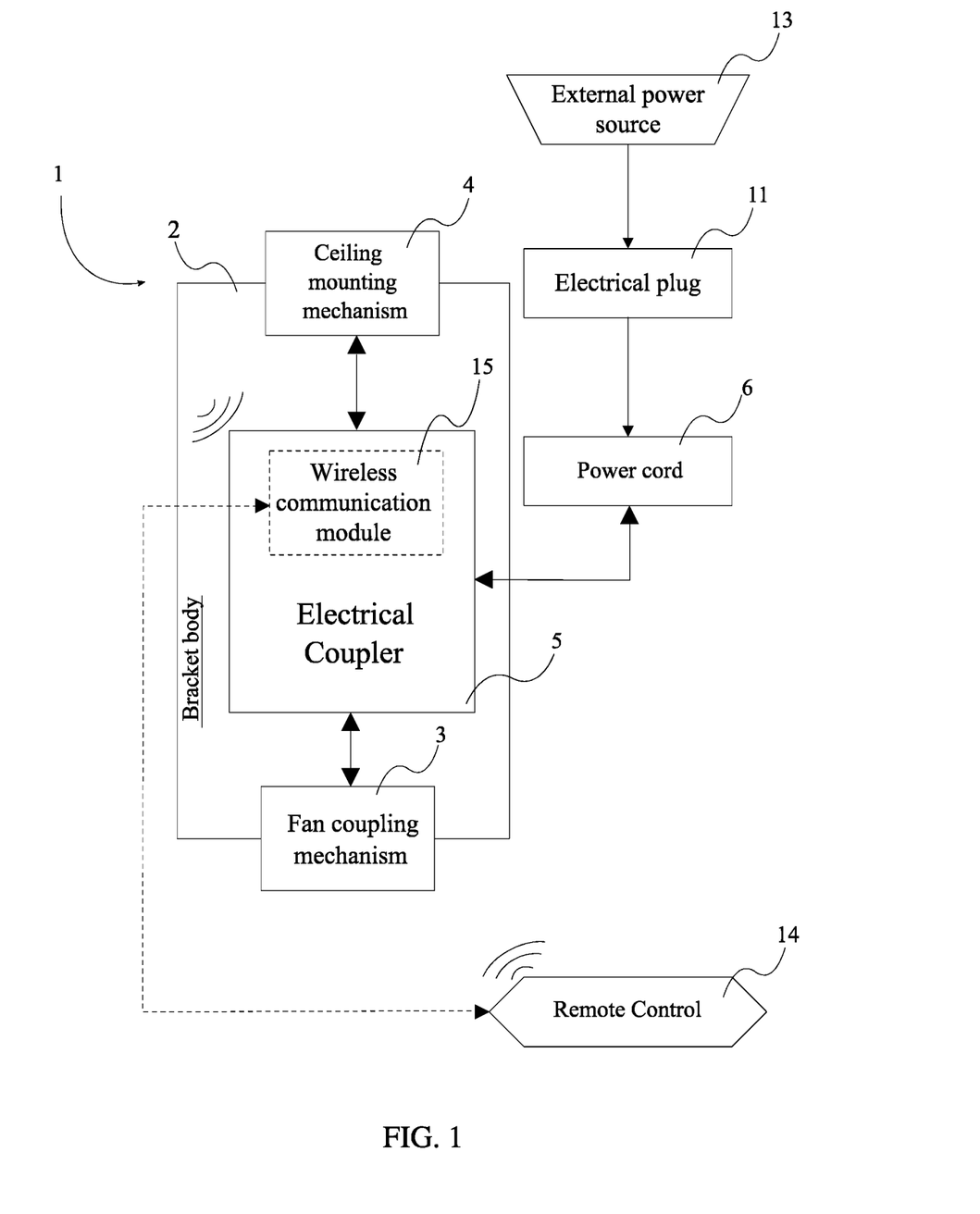
FIG. 1 is a block diagram of the present invention, wherein thinner flowlines represent electrical connections between components, thicker flowlines represent mechanical connections between components, and dashed flow lines indicate the components being communicably coupled.
Figure 5:
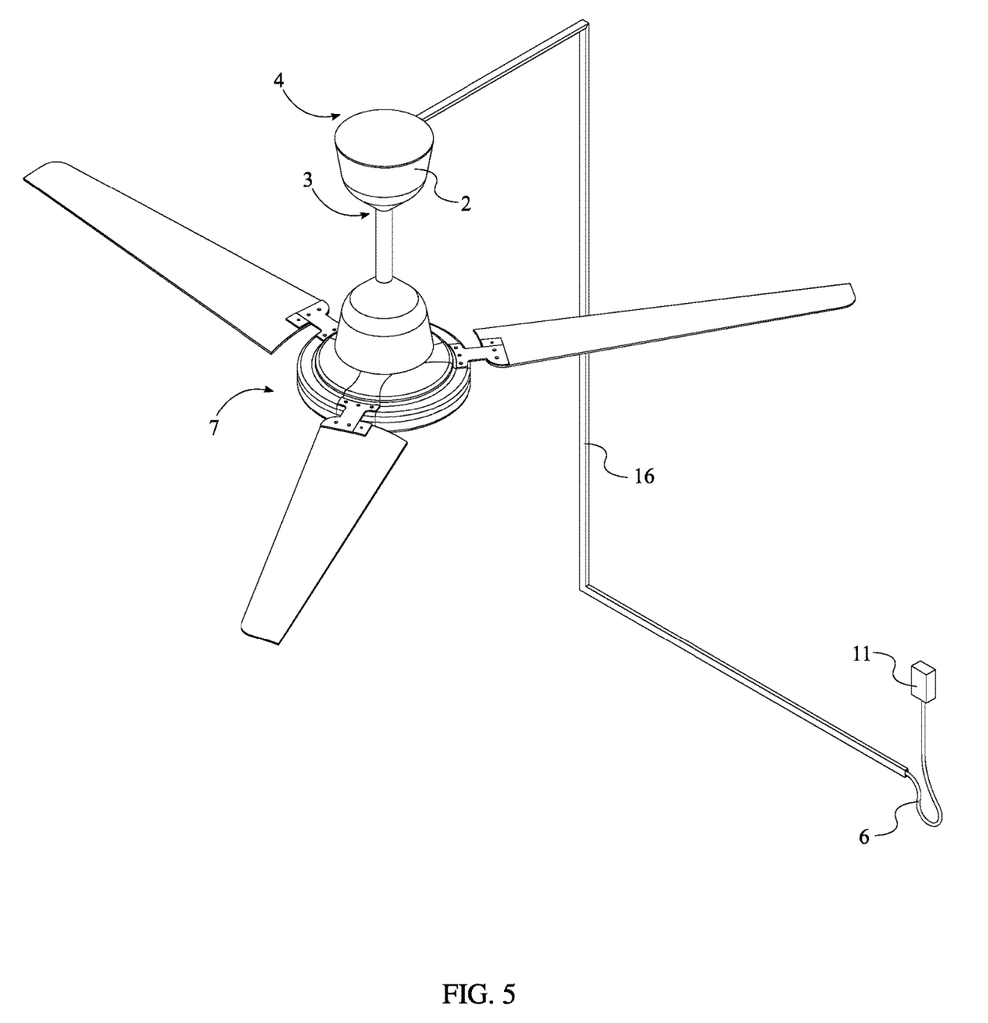
FIG. 5 is a top-front-right perspective view of the present invention, wherein a ceiling-fan is attached to the mounting bracket, the power plug is plugged into a wall outlet, and a raceway covers the power cord.
Figure 6:
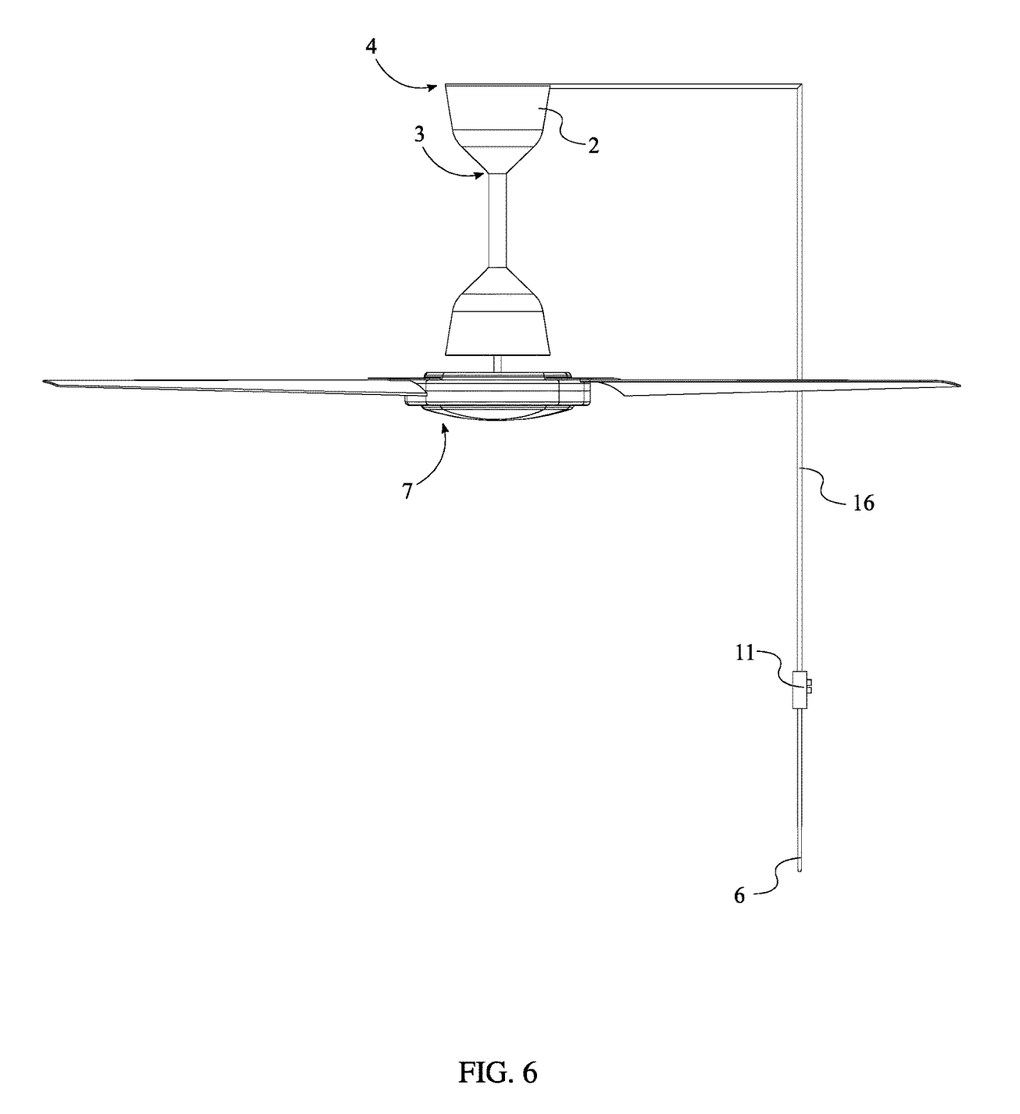
FIG. 6 is a front perspective view of FIG. 5.

According to the preferred embodiment of the present invention, the mounting kit enables the user to power a conventional ceiling mounted fan through a power outlet, without requiring hard wiring methods. In order to accomplish that, and connect the fan to the power outlet, the mounting kit comprises a power cord 6. Preferably, the power cord 6 is a dual conductor power cord that has a length to extend from the ceiling to a lower wall outlet. However, any other variety of power cords/cables, in any size, shape and/or length, that are known to one of ordinary skill in the art may be utilized, as long as the intended purpose of the present invention is not hindered. Accordingly, as seen in FIG. 1, through FIG. 6, the power cord 6 is electrically connected to the electrical coupler 5, thereby enabling the user to connect the fan electrically to the power outlet. Further, as seen in FIG. 1, FIG. 5 and FIG. 6, the fan-coupling mechanism 3 mechanically couples a ceiling fan 7 to the bracket body 2, and electrically couples the ceiling fan 7 to the electrical coupler 5. Thus, the ceiling fan 7 is electrically connected and powered from any power outlet, through the power cord 6 via the electrical coupler 5.

Figure 2:
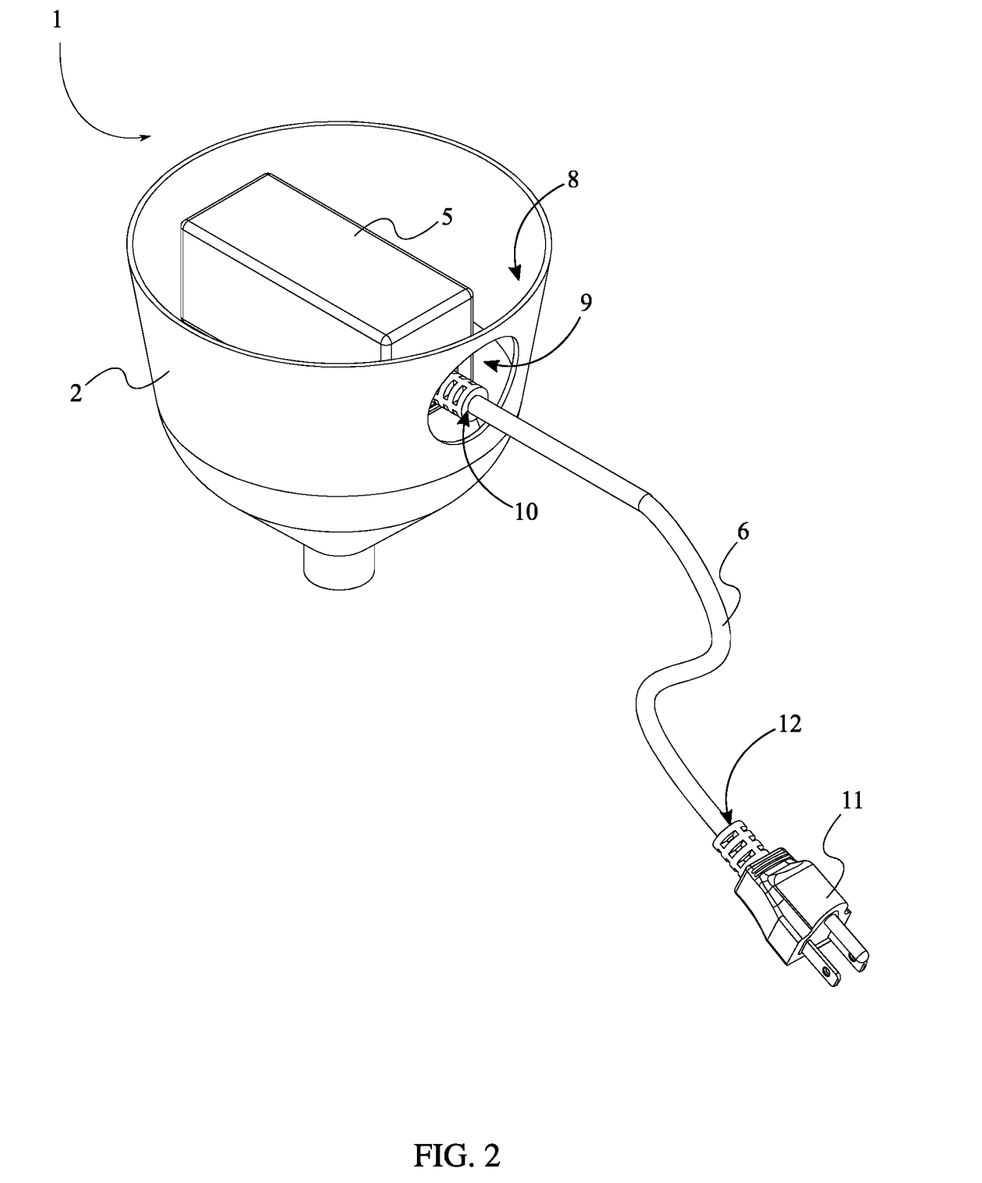
FIG. 2 is a top-front-left perspective view of the present invention.
Figure 3:
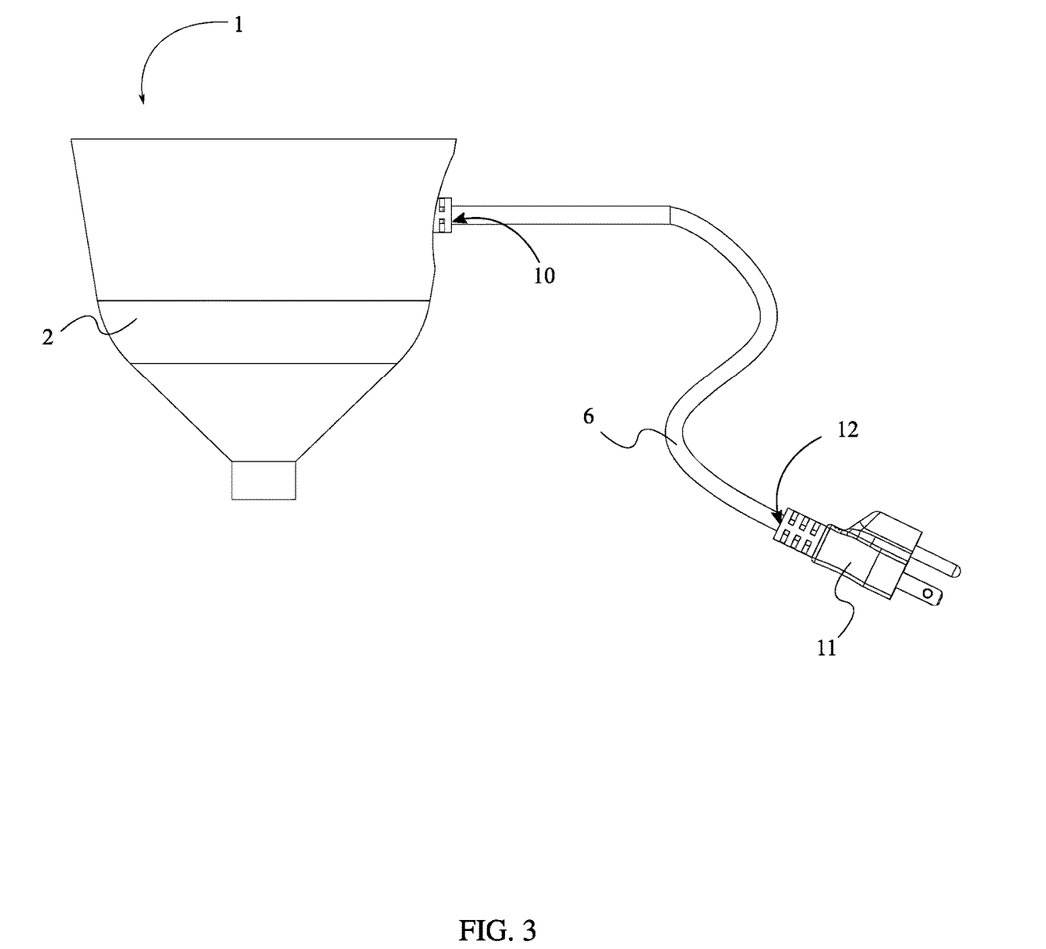
FIG. 3 is a front perspective view of the present invention.
Figure 4:
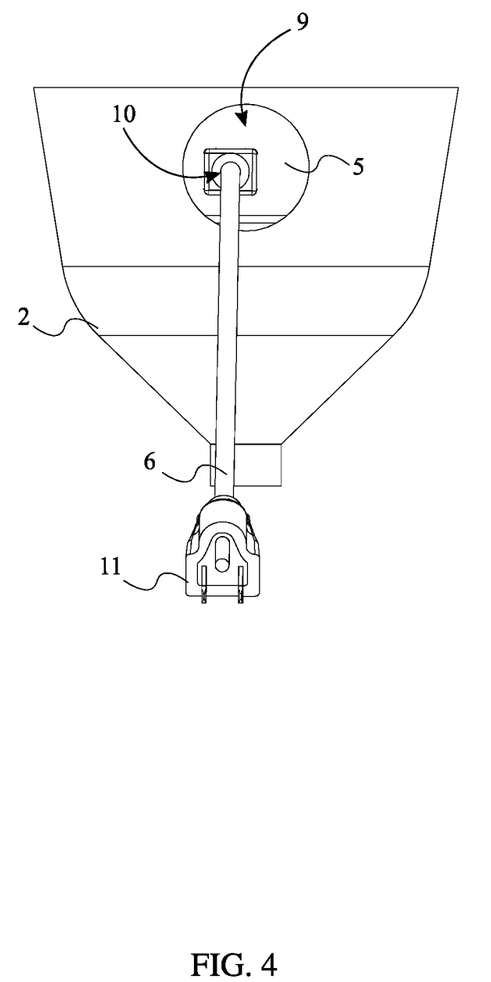
FIG. 4 is a left perspective view of the present invention.

As seen in FIG. 2 through FIG. 4, the mounting bracket 1 comprises an interior compartment 8, and an opening 9. According to the preferred embodiment, the interior compartment 8 is positioned within the bracket body 2, and the opening 9 traverses through the bracket body 2 into the interior compartment 8. Preferably, the interior compartment 8 is hollow and has dimensions big enough, for mounting the electrical coupler 5 within the interior compartment 8. Further, the size and positioning of the opening 9 are made in such a way that, a first end 10 of the power cord 6 is threaded through the opening 9, and the first end 10 of the power cord 6 is tethered to the electrical coupler 5. Thus, the opening 9 provides the pathway for the power cord 6 to the electrical coupler 5, through the bracket body 2.

According to the mounting kit, the power cord 6 comprises an electrical plug 11 attached to a second end 12, wherein the second end 12 is positioned opposite to the first end 10. As per the preferred embodiment of the present invention, the electrical plug 11 is an electrical terminal that allows the present invention to receive electrical power from an external power supply 13. Preferably, the electrical plug 11 is a polarized power plug suitable for plugging into wall power outlets. However, any other kind of plug or powering mechanism that is known to one of ordinary skill in the art may be utilized, as long as the intended purpose of the present invention is not hindered. Further, it is preferred that the external power supply 13 is a wall socket. However, multiple other sources including, but not limited to, a switched power outlet, an extended power port, a portable charging unit, or a battery powered outlet, which may be used for powering the ceiling fan 7, will fall under the scope of the present invention.

As seen in FIG. 1, the mounting kit further comprises a remote control 14, which is communicably coupled to the electrical coupler 5. According to a preferred embodiment of the present invention, the remote control 14 functions as a remote computing device that wirelessly transmits commands to the ceiling fan 7, the commands including but not limited to, turn on, turn off, regulate the speed of the ceiling fan 7 etc. In order to accomplish these remote functions, the electrical coupler 5 further comprises a wireless communication module 15 and associated electrical and electronic circuitry disposed within the electrical coupler 5. Preferably, the wireless communication module 15 is a module that connects and communicates with the remote control 14 via wireless data transmission protocols, wherein the wireless communication module 15 is capable of using standards including, but not limited to, such as Bluetooth, WI-FI, GSM, CDMA, and ZigBee. However, any other wireless communication protocols that are known to one of ordinary skill in the art may be utilized to operate the ceiling fan 7 remotely.

As seen in FIG. 5, and FIG. 6, the mounting kit further comprises a raceway 16. The cable raceway 16 can be of any shape, size, material, features, type or kind, orientation, location, quantity, components, and arrangements of components that would allow the present invention to fulfill the objectives and intents of the present invention. However, it is preferred that the cable raceway 16 be of a material similar to and/or compatible with the material of the present invention. According to the preferred embodiment of the present invention, the power cord 6 is threaded through the raceway 16. Hence, it is preferred that the cable raceway 16 comprises a hollow, open-ended, and tubular-structure, and comprises an interior diameter that enables to compactly thread the power cord 6 through the cable raceway 16. Further, the cable raceway 16 may be of an overall shape, color and/or length, such that the cable raceway 16 conforms to the shapes of the exterior surfaces of the walls, ceiling, and/or floor of the interior space where the cable raceway 16 would be mounted, to secure and constrict the power cord 6 to said walls, ceiling, and/or floors. For installing the raceway along the exterior surfaces of an enclosed space, it is preferred that the cable raceway 16 comprises a layer of adhesive material, on regions that come in contact with exterior surfaces. However, any other fastening methods or techniques that are known to one of ordinary skill in the art may be employed, to fix the cable raceway 16 to the required interior spaces/surfaces.

In an alternate embodiment of the present invention, the power cord 6 is fish wired through a wall and/or ceiling, eliminating the need of the cable raceway 16. In the alternate embodiment, the length of the power cord 6 ranges between 20-30 feet. However, any other length or kind of power cord 6 or power plug 11, that do not hinder the intended purposes of the present invention may be utilized, to connect the ceiling fan 7 to the external power outlet 13, without hard wiring the ceiling fan.

Although the invention has been explained in relation to its preferred embodiment, it is to be understood that many other possible modifications and variations can be made without departing from the spirit and scope of the invention as hereinafter claimed.

What is claimed is:

1. A mounting kit for a plug-in ceiling fan comprising:
   a mounting bracket;
   a power cord;
   a remote control;
   a raceway;
   the mounting bracket comprising a bracket body, a fan-coupling mechanism, a ceiling-mounting mechanism, an electrical coupler, an interior compartment and an opening;
   the fan-coupling mechanism being mounted adjacent to the bracket body;
   the fan-coupling mechanism being configured to mechanically couple a ceiling fan to the bracket body;
   the fan-coupling mechanism being configured to electrically couple the ceiling fan to the electrical coupler;
   the ceiling-mounting mechanism being mounted adjacent to the bracket body, opposite to the fan-coupling mechanism;
   the electrical coupler being mounted within the bracket body;
   the interior compartment being positioned within the bracket body;

the opening traversing through the bracket body into the interior compartment;

the electrical coupler being mounted within the interior compartment;

the power cord being electrically connected to the electrical coupler;

the power cord comprising a first end, a second end and an electric plug;

the first end being threaded through the opening;

the first end being tethered to the electrical coupler;

the second end being positioned opposite to the first end;

the electric plug being attached to the second end;

the electric plug being a polarized power plug suitable for plugging into wall power outlets;

the remote control being communicably coupled to the electrical coupler; and the power cord being threaded through the raceway.

2. The mounting kit of claim 1, wherein the power cord is fish wired through a wall.

3. The mounting kit of claim 1, wherein a length of the power cord ranges between 20 to 30 feet.

\* \* \* \* \*